(12) United States Patent
Noguchi

(10) Patent No.: US 7,035,161 B2
(45) Date of Patent: Apr. 25, 2006

(54) SEMICONDUCTOR INTEGRATED CIRCUIT

(75) Inventor: Mineo Noguchi, Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 134 days.

(21) Appl. No.: 10/731,083

(22) Filed: Dec. 10, 2003

(65) Prior Publication Data

US 2004/0141369 A1  Jul. 22, 2004

(30) Foreign Application Priority Data

Jan. 20, 2003  (JP) ............ 2003-010586

(51) Int. Cl.
G11C 8/00 (2006.01)
G11C 7/00 (2006.01)
G11C 7/02 (2006.01)
G06F 12/00 (2006.01)

(52) U.S. Cl. ............ 365/230.03; 365/189.03; 365/189.05; 365/214; 711/5; 711/105; 711/111

(58) Field of Classification Search ........... 365/230.03, 365/189.03, 189.05, 214; 711/5, 105, 111
See application file for complete search history.

(56) References Cited

U.S. PATENT DOCUMENTS

| | | | | |
|---|---|---|---|---|
| 4,809,229 A | * | 2/1989 | Nukiyama | 365/189.02 |
| 5,216,637 A | * | 6/1993 | Vaillancourt | 365/230.03 |
| 5,343,427 A | * | 8/1994 | Teruyama | 365/189.04 |
| 5,781,493 A | * | 7/1998 | Kobayashi | 365/230.03 |
| 5,838,604 A | * | 11/1998 | Tsuboi et al. | 365/63 |
| 5,854,767 A | * | 12/1998 | Nishi et al. | 365/219 |
| 6,115,301 A | * | 9/2000 | Namekawa | 365/200 |
| 6,144,615 A | * | 11/2000 | Toda | 365/233 |
| 6,272,594 B1 | * | 8/2001 | Gupta et al. | 711/127 |
| 6,310,815 B1 | * | 10/2001 | Yamagata et al. | 365/230.03 |
| 6,333,889 B1 | * | 12/2001 | Arimoto | 365/230.03 |
| 6,421,294 B1 | * | 7/2002 | Hidaka | 365/230.03 |
| 6,538,928 B1 | * | 3/2003 | Mobley | 365/189.05 |
| 6,661,731 B1 | * | 12/2003 | Fujimoto | 365/230.03 |
| 6,728,162 B1 | * | 4/2004 | Lee et al. | 365/233 |
| 2004/0013017 A1 | * | 1/2004 | Takashima | 365/202 |
| 2005/0152172 A1 | * | 7/2005 | Jeong et al. | 365/145 |

FOREIGN PATENT DOCUMENTS

JP  2001-344976  12/2001

* cited by examiner

Primary Examiner—Amir Zarabian
Assistant Examiner—Ly Duy Pham
(74) Attorney, Agent, or Firm—Donald R. Studebaker; NixonPeabody, LLP

(57) ABSTRACT

An I/O interface circuit immediately close to a bank having a plurality of memory cells and an I/O circuit is directly connected to data line pairs via a switching circuit. Another I/O interface circuit is connected to other data line pairs via switching circuits and data bus pairs. Consequently the number of lines of the data bus pairs provided within the chip of the semiconductor integrated circuit is half of the number in the prior art, and the chip area can be reduced.

6 Claims, 5 Drawing Sheets

SEMICONDUCTOR INTEGRATED CIRCUIT

BACKGROUND OF THE INVENTION

1. Field of the Invention

The present invention relates to a semiconductor integrated circuit in which the area occupied by a data bus made of data line pairs is reduced, so that the chip area can be decreased.

2. Description of the Related Art

One of semiconductor integrated circuits is described in Japanese Patent Application Kokai (Laid-open Publication) No. 2001-344976.

The semiconductor integrated circuit of Japanese Patent Application Kokai No. 2001-344976 has a plurality of banks and a plurality of I/O circuits. The banks include a plurality of memory cells and can write data to and read from the memory cells. Each I/O circuit includes pads, input/output (hereafter "I/O") buffers, and an I/O interface circuit. The banks are connected to the data bus, and the I/O circuits are also connected to the data bus.

In this semiconductor integrated circuit, data read from one or more memory cells in a certain bank is output to the data bus and transmitted on the data bus. Data transmitted on the data bus is captured by a certain I/O circuit and output to an external circuit or device. Data input from a certain I/O circuit is input to the data bus, is transmitted on the data bus, and is written to one or more memory cells within a certain bank.

In the semiconductor integrated circuit of the above mentioned Japanese Patent Application Kokai, I/O data processed by the bank(s) and I/O circuit(s) are exchanged through the data bus which extends long within the chip. The long data bus is provided within the chip according to the I/O data bus length of the product specification.

If the data bus has a considerable length in the chip, countermeasures, such as the insertion of shielded lines and the positioning of circuits which may become noise sources in positions other than below the wiring layer of the data bus, must be adopted in order to avoid the influence of crosstalk (signal leakage) between the data bus, other neighboring wiring, and circuits below the data bus. Hence as the amount of data transmitted is increased and the number of lines of the data bus increases, the chip area increases.

SUMMARY OF THE INVENTION

One object of the present invention is to provide a semiconductor integrated circuit enabling reduction of the number of data bus lines, and consequently reduction of the chip area.

According to one aspect of the present invention, there is provided an improved semiconductor integrated circuit. The semiconductor integrated circuit includes a plurality of banks. Each bank has a plurality of memory cells. Each bank can write and read n-bit data (where n is a positive integer) to and from the memory cells. The semiconductor integrated circuit also includes a plurality of I/O modules. Each I/O module can receive a plurality of bits of data from an external circuit and output a plurality of bits of data to the external circuit. The semiconductor integrated circuit also includes an n/2-bit data bus extending along the banks.

Between each of the banks and the data bus is provided an n bits of first data line pair which performs data transmission between the bank concerned and the data bus. In addition, between the data bus and each of the I/O modules is provided an n/2 bits of second data line pair which performs data transmission between the data bus and the I/O module concerned. A switching circuit is provided at each of connections between the first data line pairs and the data bus, and between the second data line pairs and the data bus. The switching circuits performs a switching operation based on a control signal, such that one of the first data line pairs is connected to one of the I/O modules via one of the second data line pairs without using the data bus, and is also connected to other I/O modules via the data bus and other second data line pairs.

Data from one or more memory cells in a certain bank is output to the first data line pair extending from this bank. This data is then sent to a certain I/O module via one of the second data line pairs by the associated switching circuit, and eventually output to the external circuit. In the meantime, the same data is also sent to other I/O modules via the data bus and other second data line pairs by other switching circuits, and eventually output to the associated external circuits.

The I/O module located closest to the bank concerned is connected directly to the bank by the first and second data line pairs via the associated switching circuit. Other I/O modules are connected to the bank via other switching circuits the data bus. Therefore, the number of data bus lines provided within the chip of the semiconductor integrated circuit is reduced, and the chip area can be decreased.

Other objects, aspects and advantages of the present invention will become apparent to those skilled in the art to which the present invention pertains from the subsequent detailed description and appended claims, taken in conjunction with the accompanying drawings.

DETAILED DESCRIPTION OF THE INVENTION

First Embodiment

Figure 1:
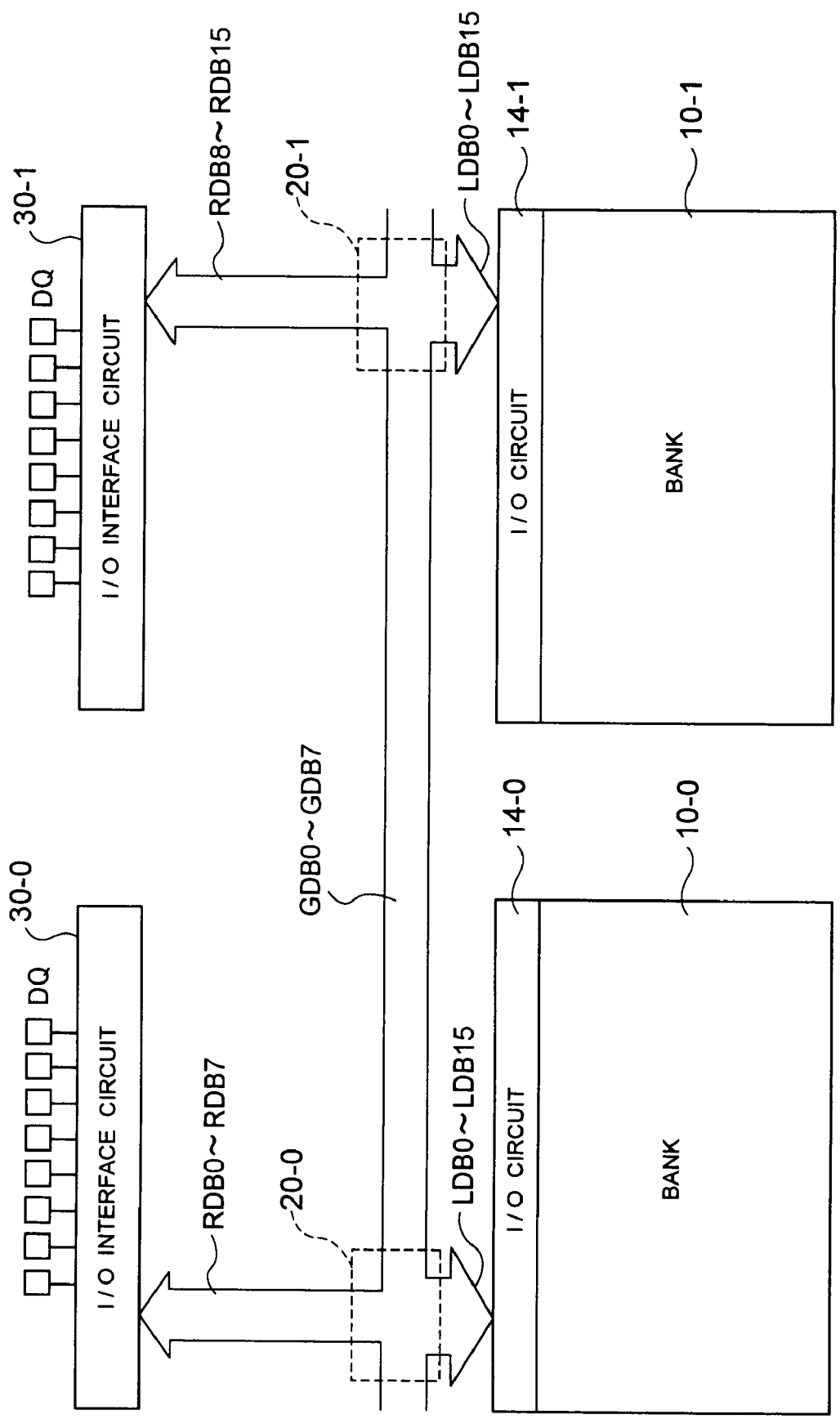
FIG. 1 schematically illustrates the configuration of a semiconductor integrated circuit according to a first embodiment of the present invention.

Referring to FIG. 1, the configuration of a semiconductor integrated circuit according to a first embodiment of the present invention will be described.

The semiconductor integrated circuit has a plurality of banks of synchronous dynamic random access memory (hereafter referred to as "SDRAM"). In the illustrated embodiment, the semiconductor integrated circuit includes two banks, 10-0 and 10-1, each having a plurality of memory cells.

In the bank 10-0 is provided an I/O circuit 14-0 to switch input and output of n-bit (for example, 16-bit) data. This I/O circuit 14-0 is connected to the 16 bits of first data line pairs LDB0 to LDB15, and these data line pairs LDB0 to LDB15 are connected to the 8 bits of second data line pairs RDB0 to RDB7 and the 8-bit data bus GDB0 to GDB7 via the switching unit 20-0. The data line pairs RDB0 to RDB7 are connected to an 8-bit I/O module (for example, an I/O interface circuit 30-0 having an 8-bit I/O pad DQ).

In the bank 10-1 is provided an I/O circuit 14-1 to switch input and output of n-bit (for example, 16-bit) data. This I/O circuit 14-1 is connected to the 16 bits of first data line pairs LDB0 to LDB15, and these data line pairs LDB0 to LDB15 are connected to the 8 bits of second data line pairs RDB0 to RDB7 and the 8-bit data bus GDB0 to GDB7 via the switching unit 20-1. The data line pairs RDB0 to RDB7 are connected to an 8-bit I/O module (for example, an I/O interface circuit 30-1 having an 8-bit I/O pad DQ).

Figure 2:
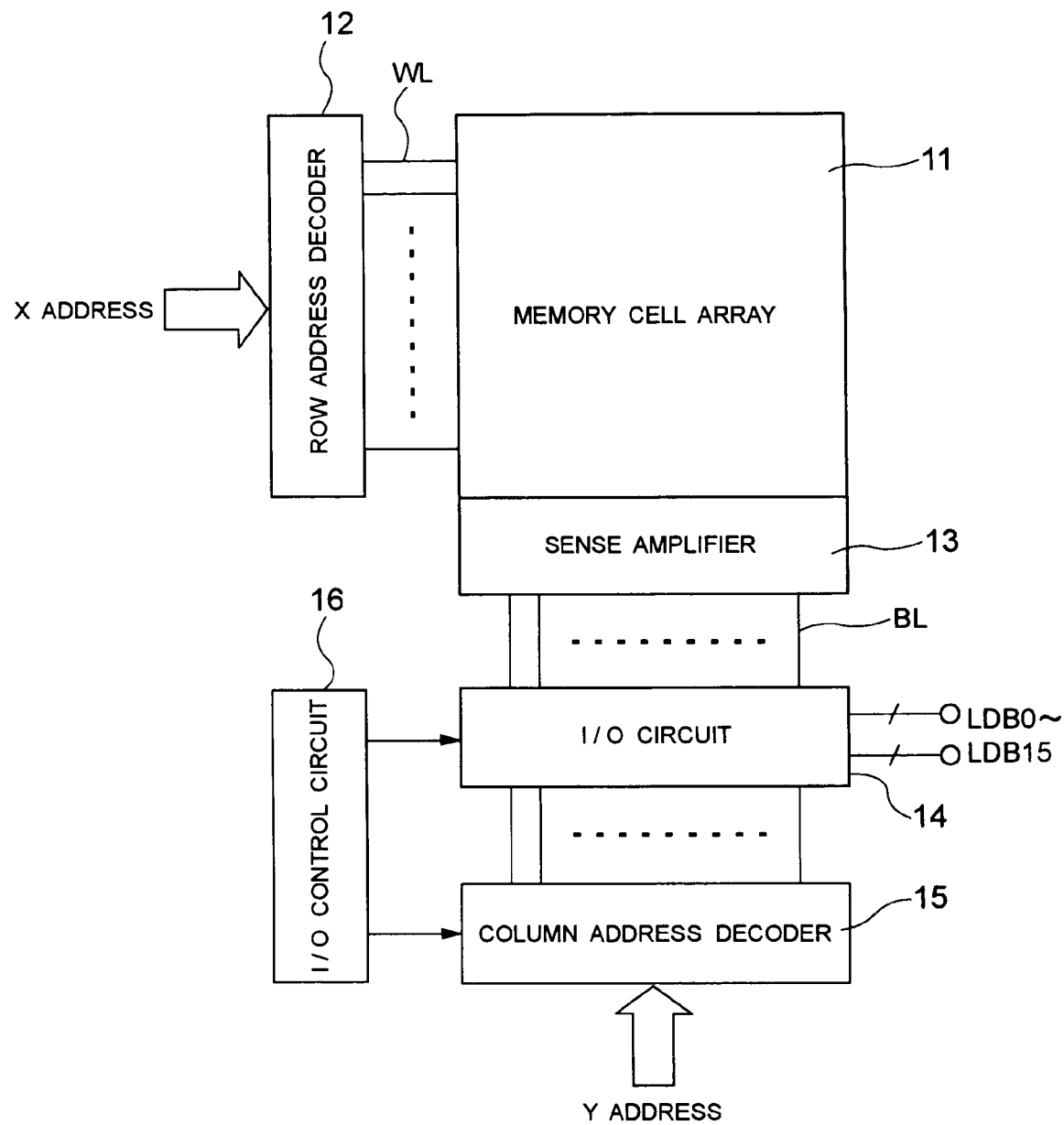
FIG. 2 illustrates the configuration of one of the banks shown in FIG. 1.

Referring to FIG. 2, the configuration of the bank 10-0 (or 10-1) is schematically illustrated.

The banks 10-0 and 10-1 employ the same configuration so that only the bank 10-0 will be described below. The bank 10-0 has a memory cell array 11. The memory cell array 11 has a plurality of word lines WL and a plurality of bit lines BL intersecting the word lines. Memory cells are positioned, in matrix form, at the intersection locations of the word lines WL and bit lines BL. A row address decoder 12 is connected to the word lines WL. The row address decoder 12 decodes an input X address, and selects and activates one of the word lines WL.

The bit lines BL are connected, via a sense amplifier 13, to an I/O circuit 14 (14-0, 14-1) and to a column address decoder 15. The sense amplifier 13 detects and amplifies data on a pair of bit lines BL read from a memory cell. The column address decoder 15 decodes an input Y address and outputs a bit line selection signal. The I/O circuit 14 connects and disconnects the pairs of bit lines BL and the pairs of data lines LDB0 to LDB15, based on the bit line selection signal. Data input and output, chip selection, precharging and the like of the I/O circuit 14 and column address decoder 15 are controlled by an I/O control circuit 16.

Figure 3:
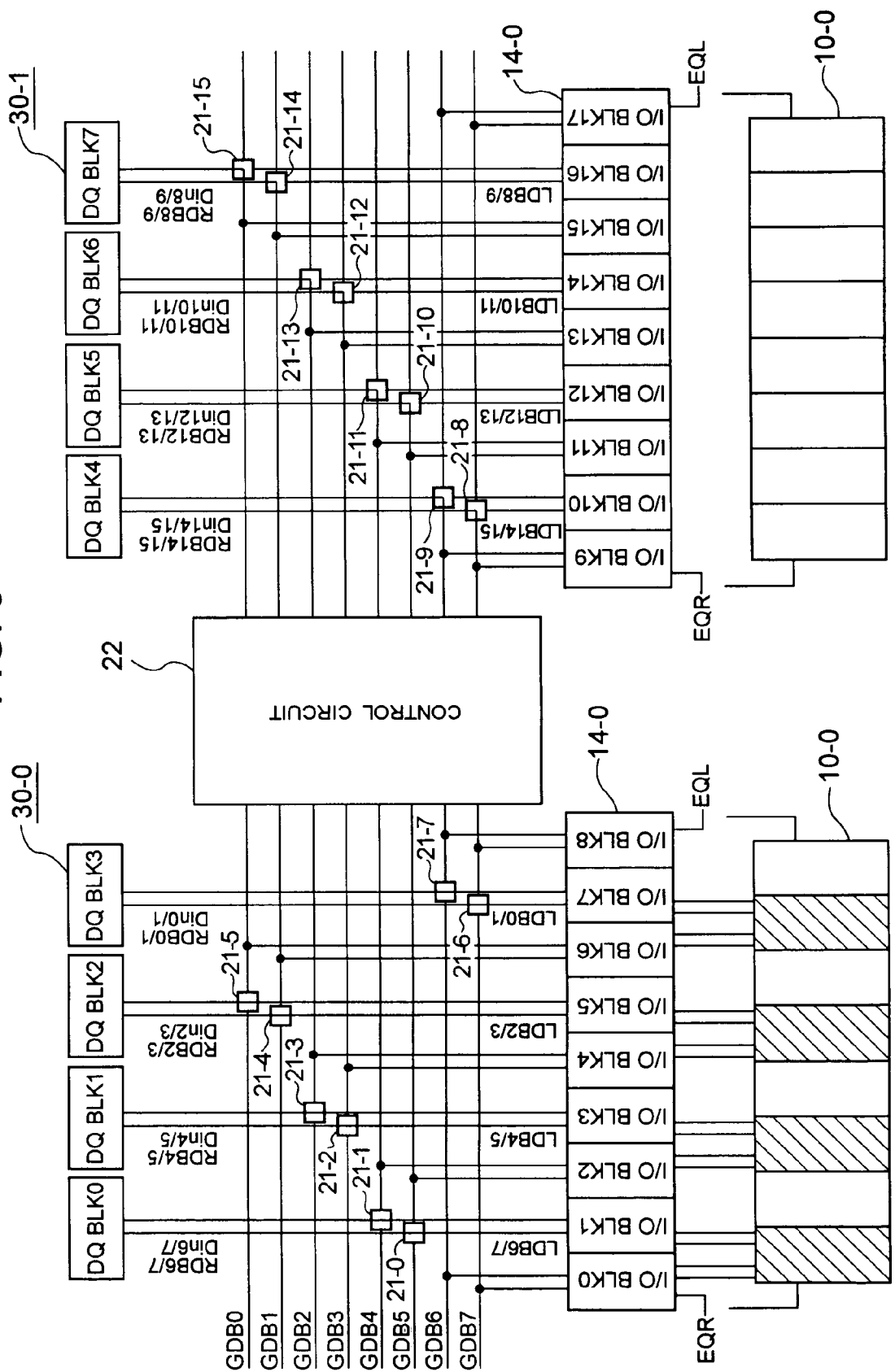
FIG. 3 illustrates I/O connections of the I/O circuit and I/O interface circuit of one of the banks shown in FIG. 1.

FIG. 3 illustrates I/O connections of the I/O circuit 14-0 and I/O interface circuit 30-0 of the bank 10-0 in FIG. 1.

The I/O circuit 14-0 provided within the bank 10-0 includes 18 I/O blocks (referred to as "I/OBLK0" to "I/OBLK17"). Pull-up and pull-down of the data bus GDB7 to GDB0 are switched by the I/OBLK0, 2, 4, 6, 8, 9, 11, 13, 15, 17. The I/OBLK1, 3, 5, 7, 10, 12, 14, 16 are connected to data line pairs LDB6/7, 4/5, 2/3, 0/1, 14/15, 12/13, 10/11, 8/9. The data line pairs LDB6/7, 4/5, 2/3, 0/1, 14/15, 12/13, 10/11, 8/9 are connected to either the data line pairs RDB6/7, 4/5, 2/3, 0/1, 14/15, 12/13, 10/11, 8/9, or to the data buses GDB7 to 0, by the switching circuits 21-0 to 21-15 of the switching module 20-0. A control signal to switch the switching circuits 21-0 to 21-15 is supplied by the control circuit 22. The control circuit 22 is for example provided below the data bus GDB0 to GDB7.

The data line pairs RDB6/7, 4/5, 2/3, 0/1 are connected to the I/O interface circuit 30-0, and the data line pairs RDB14/15, 12/13, 10/11, 8/9 are connected to the I/O interface circuit 30-1. Each of the I/O interface circuits 30-0 and 30-1 includes four blocks (hereafter referred to as "DQBLKs"). Specifically, the I/O interface circuit 30-0 includes DQBLK0 to DQBLK3, and the I/O interface circuit 30-1 includes DQBLK4 to DQBLK7. The data line pairs RDB6/7, 4/5, 2/3, 0/1, 14/15, 12/13, 10/11, 8/9 in FIG. 3 function as input line pairs Din6/7, 4/5, 2/3, 0/1, 14/15, 12/13, 10/11, 8/9 when data is input from the DQBLK0 to 7 of the I/O interface circuits 30-0, 30-1.

Figure 4:
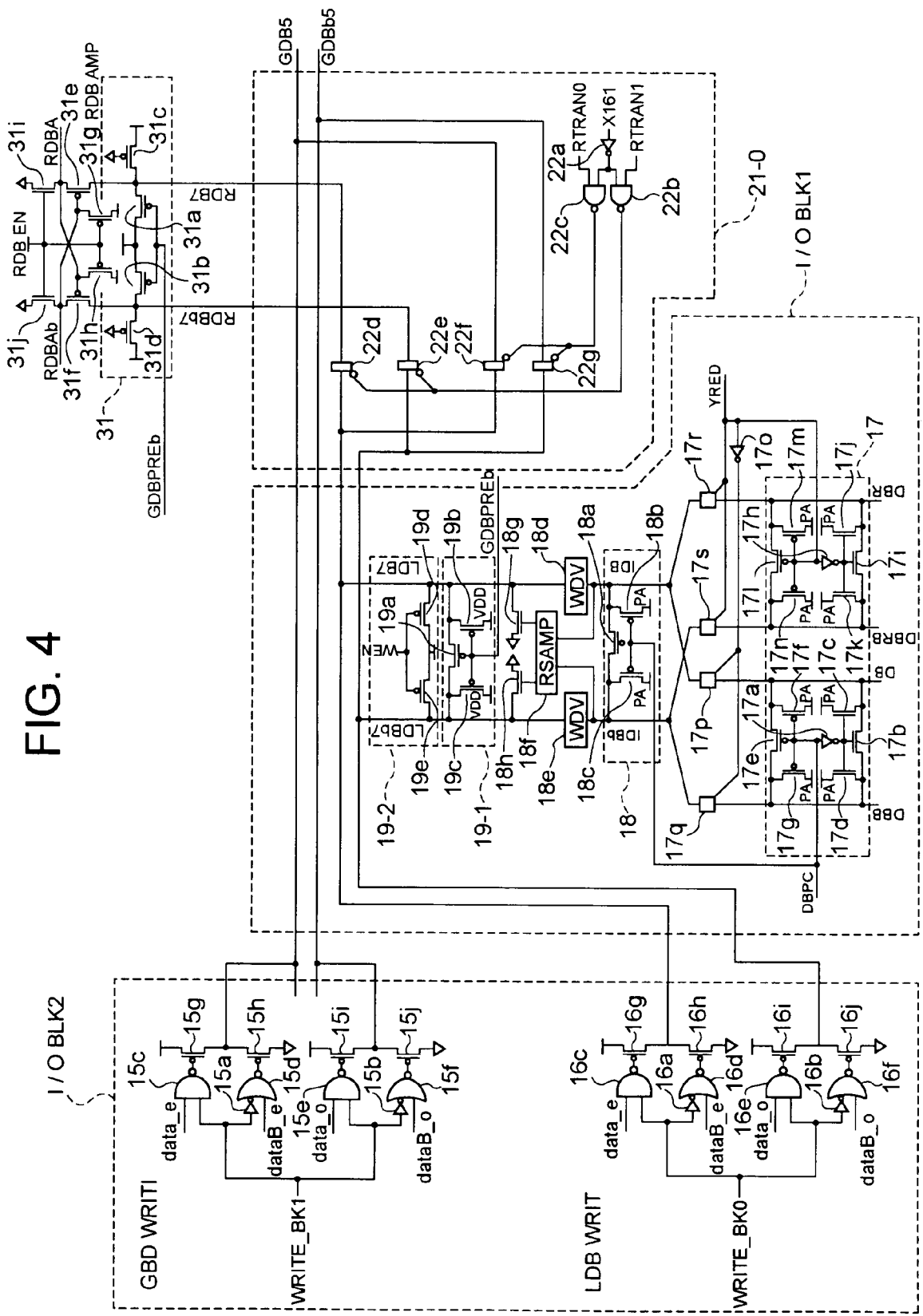
FIG. 4 is a circuit diagram of I/O blocks, switching circuit, and I/O interface circuit block in FIG. 3; and, FIG. 5 illustrates the configuration of the semiconductor integrated circuit according to a second embodiment of the present invention.

FIG. 4 is a circuit diagram of the I/OBLK1, I/OBLK2, switching circuit 21-0, and DQBLK0 in FIG. 3 when the bank 10-0 in FIG. 1 is active.

Each of the data buses GDB0 to GDB7 in FIG. 3 includes a pair of a positive-polarity data line (one of GDB0 to GDB7) and a negative-polarity data line (one of GDBb0 to GDBb7). Each of the data line pairs LDB0 to LDB15 has two lines, namely, a positive-polarity data line (one of LDB0 to LDB15) and a negative-polarity data line (one of LDBb0 to LDBb15). Each of the data line pairs RDB0 to RDB7 has two lines, namely, a positive-polarity data line (one of RDB0 to RDB7) and a negative-polarity data line (one of RDBb0 to RDBb7). Each of the data line pairs RDB8 to RDB15 has two lines, namely, a positive-polarity data line (one of RDB8 to RDB15) and a negative-polarity data line (one of RDBb8 to RDBb15). The pair of data lines GDB5, GDBb5 of the data bus GDB5, and the pair of data lines LDB7, LDBb7 of the data line pair LDB7, are switched to pull-up or pull-down by the I/OBLK2 within the I/O circuit 14-0.

The I/OBLK2 has a data line pair writing (GDB WRITI) circuit and another data line pair writing (LDB WRIT) circuit.

The data line pair writing (GDB WRITI) circuit has inverters 15a, 15b, two-input NAND gates 15c, 15e, two-input NOR gates 15d, 15f, P-channel MOS (hereafter referred to as "PMOS") transistors 15g, 15i, and N-channel MOS (hereafter referred to as "NMOS") transistors 15h, 15j. Among the write signal WRITE_BK1 (="1"), even data data_e, dataB_e (="1"), and odd data data_o, dataB_o (="0") supplied from the bank 10-0, the write signal WRITE_BK1 is input to the NAND gates 15c, 15e, and the write signal WRITE_BK1 is inverted by the inverters 15a, 15b and input to the NOR gates 15d, 15f. The output terminal of the NAND gate 15c is connected to the gate of the PMOS transistor 15g. The output terminal of the NOR gate 15d is connected to the gate of the NMOS transistor 15h. The output terminal of the NAND gate 15e is connected to the gate of the PMOS transistor 15i. The output terminal of the NOR gate 15f is connected to the gate of the NMOS transistor 15j. The PMOS transistor 15g and NMOS transistor 15h are connected in series between a power supply potential VDD node and ground potential node, and the connection point of the PMOS transistor 15g and NMOS transistor 15h is connected to the data line GDB5. The PMOS transistor 15i and NMOS transistor 15j are connected in series between a power supply potential VDD node and a ground potential node, and the connection point of the PMOS transistor 15i and NMOS transistor 15j is connected to the data line GDBb5.

In this data line pair writing (GDB WRITI) circuit, a write signal WRITE_BK1 (="1") supplied from the bank 10-0 is inverted by the inverters 15a, 15b, and the even data data_e (="1") supplied from the bank 10-0 and write signal WRITE_BK1 (="1") are NANDed by the NAND gate 15c. The output signal (="0") of the NAND gate 15c turns on the PMOS transistor 15g, and pulls up the data line GDB5 to the power supply potential VDD. At this time, the output signal (="0") of the inverter 15a and the even data dataB_e (="1") supplied from the bank 10-0 are NORed by the NOR gate 15d, and the output signal (="0") of the NOR gate 15d turns off the NMOS transistor 15h and releases the data line GDB5 from ground potential. The odd data data_o (="0") supplied from the bank 10-0 and the write signal WRITE_BK1 (="1") are NANDed by the NAND gate 15e, and the output signal (="1") of the NAND gate 15e turns off the PMOS transistor 15i and releases the data line GDBb5 from the power supply potential VDD. At this time, the inverter 15b output signal (="0") and the odd data dataB_o (="0") supplied from the bank 10-0 are NORed by the NOR gate 15f, and the output signal (="1") of the NOR gate 15f turns on the NMOS transistor 15j to pull down the data line GDBb5 to ground potential.

Similar to the data line pair writing (DGB WRITI) circuit, the data line pair writing (LDB WRIT) circuit includes inverters 16a, 16b, NAND gates 16c, 16e, NOR gates 16d, 16f, PMOS transistors 16g, 16i, and NMOS transistors 16h, 16j.

In this data line pair writing (LDB WRIT) circuit, similar to the data line pair writing (GDB WRITI) circuit, the data line LDB7 is pulled up to the power supply potential VDD and the data line LDBb7 is pulled down to ground potential, based on a write signal WRITE_BK0 (="1"), even data data_e, dataB_e (="1"), and odd data data_o, dataB_o (="0") supplied from the bank 10-0.

The I/OBLK1 is a circuit which outputs data read from the bank 10-0 to the pair of data lines LDB7, LDBb7, and writes data input from the pair of data lines LDB7, LDBb7 to the bank 10-0. The I/OBLK1 has a precharge circuit 17 to precharge the data line pair DB, DBB and data line pair DBR, DBRB connected to the bit line pair BL. The I/OBLK1 also has an inverter 17o which inverts the read signal YRED, output buffers 17p, 17q, input buffers 17r, 17s, and a precharge circuit 18 which precharges the data line pair IDB, IDBb. The I/OBLK1 also has write drivers (WDV) 18d, 18e, a set/reset amplifier (RS AMP) 18f, set/reset NMOS transistors 18g, 18h, a GDB precharge (GDB PRECHARGE) circuit 19-1, and a GDB pull-up (GDB PULLUP) circuit 19-2.

The precharge circuit 17 is a circuit which precharges the data line pair DB, DBB and data line pair DBR, DBRB based on a precharge signal DBPC and read signal YRED from the bank 10-0. The precharge circuit 17 includes a precharge circuit for the data line pair DB, DBB, and a precharge circuit for the data line pair DBR, DBRB.

The precharge circuit for the data line pair DB, DBB includes an inverter 17a which inverts the precharge signal DBPC, an NMOS transistor 17b which connects and disconnects the data line DB and data line DBB according to the output signal of the inverter 17a, an NMOS transistor 17c which connects and disconnects the data line DB and pad PA according to the output signal of the inverter 17a, and an NMOS transistor 17d which connects and disconnects the data line DBB and pad PA according to the output signal of the inverter 17a. This precharge circuit also includes an NMOS transistor 17e which connects and disconnects the data line DB and data line DBB according to the precharge signal DBPC, an NMOS transistor 17f which connects and disconnects the data line DB and pad PA according to the precharge signal DBPC, and an NMOS transistor 17g which connects and disconnects the data line DBB and pad PA according to the precharge signal DBPC.

Similar to the precharge circuit for the data line pair DB, DBB, the precharge circuit for the data line pair DBR, DBRB includes an inverter 17h which inverts a read signal YRED, an NMOS transistor 17i which connects and disconnects the data line DBR and data line DBRB according to the output signal of the inverter 17h, an NMOS transistor 17j which connects and disconnects the data line DBR and pad PA according to the output signal of the inverter 17h, and an NMOS transistor 17k which connects and disconnects the data line DBRB and pad PA according to the output signal of the inverter 17h. This precharge circuit also includes an NMOS transistor 17l which connects and disconnects the data line DBR and data line DBRB according to the read signal YRED, an NMOS transistor 17m which connects and disconnects the data line DBR and pad PA according to the read signal YRED, and an NMOS transistor 17n which connects and disconnects the data line DBRB and pad PA according to the read signal YRED.

The output buffers 17p, 17q connect and disconnect the data line pair DB, DBB and the data line pair IDB, IDBb, based on the signal resulting when the inverter 17o inverts the read signal YRED. The input buffers 17r, 17s connect and disconnect the data line pair DBR, DBRB and the data line pair IDB, IDBb, based on the read signal YRED.

The precharge circuit 18 for the data line pair IDB, IDBb includes a PMOS transistor 18a which connects and disconnects the data line IDB and the data line IDBb based on a precharge signal DBPC, an NMOS transistor 18b which connects and disconnects the data line IDB and pad PA based on the precharge signal DBPC, and an NMOS transistor 18c which connects and disconnects the data line IDBb and pad PA based on the precharge signal DBPC. The pair of data lines IDB, IDBb is connected to the data lines LDB7 and LDBb7 via the write drivers (WDV) 18d, 18e. The set/reset amplifier (RS AMP) 18f amplifies the data of the data line IDB7 or IDBb7, and the output signal of the set/reset amplifier 18f controls turn-on and turn-off of the NMOS transistor 18g connected between the data line LDB7 and the power supply potential VDD node as well as the NMOS transistor 18h connected between the data line LDBb7 and the power supply potential VDD node.

The GDB precharge (GDB PRECHARGE) circuit 19-1 precharges the data line pair LDB7, LDBb7 in response to the precharge signal GDBPREb supplied from the bank 10-0. The GDB precharge (GDB PRECHARGE) circuit 19-1 includes a PMOS transistor 19a which connects and disconnects the data line LDB7 and the data line LDBb7 according to the precharge signal GDBPREb, a PMOS transistor 19b which connects and disconnects the data line LDB7 and the power supply potential VDD node according to the precharge signal GDBPREb, and a PMOS transistor 19c which connects and disconnects the data line LDBb7 and the power supply potential VDD node according to the precharge signal GDBPREb.

The GDB pull-up (GDB PULLUP) circuit 19-2 pulls up the data line pair LDB7, LDBb7 according to a write enable signal WEN supplied from the bank 10-0. The GDB pull-up circuit 19-2 has PMOS transistors 19d, 19e to the gates of which the write enable signal WEN is supplied. The PMOS transistor 19d is connected between the data line LDB7 and the power supply potential VDD node, and the PMOS transistor 19e is connected between the data line LDBb7 and the power supply potential VDD node.

The switching circuit 21-0 includes an inverter 22a which inverts an X address X161, and a two-input NAND gate 22b which receives a control signal RTRAN1 from the control circuit 22 and the output signal of the inverter 22a. The switching circuit 21-0 also includes a two-input NAND gate 22c which receives a control signal RTRAN0 from the control circuit 22 and the output signal from the inverter 22a. The switching circuit 21-0 also includes switching elements 22d, 22e which are turned on and off by the output signal from the NAND gate 22b to connect and disconnect the data line pair LDB7, LDBb7 and the data line pair RDB7, RDBb7. The switching circuit 21-0 also includes switching elements 22f, 22g which are turned on and off by the output signal from the NAND gate 22c to connect and disconnect the data line pair LDB7, LDBb7 and the data buses GDB5, GDBb5. The switching elements 22d, 22e, 22f, 22g include buffers and other necessary parts.

The DQBLK0 in the I/O interface circuit 30-0 supplies data from the data line pair RDB7, RDBb7 to an external circuit and supplies data from an external circuit to the data line pair RDB7, RDBb7. The DQBLK0 includes an RDB amplifier (RDB AMP) 31 and a latch circuit.

The RDB amplifier (RDB AMP) 31 amplifies the data on the data line pair RDB7, RDBb7, and has PMOS transistors 31a, 31b and PMOS transistors 31c, 31d, to the gates of which the signal GDBPREb is supplied. The PMOS transistor 31a is connected between the data line RDB7 and the power supply potential VDD node. The PMOS transistor 31b is connected between the data line RDBb7 and the power supply potential VDD node. The data line RDB7 is connected to the power supply potential VDD node via the PMOS transistor 31c, and the data line RDBb7 is connected to the power supply potential VDD node via the PMOS transistor 31d.

The latch circuit has PMOS transistors 31e, 31f, 31g, 31h, and NMOS transistors 31i, 31j. The PMOS transistor 31e is connected between the data line RDB7 and the data line RDBA. The PMOS transistor 31f is connected between the data line RDBb7 and the data line RDBAb. The PMOS transistors 31e, 31f are cross-connected so as to latch the data. The gate of the PMOS transistor 31e is connected to the power supply potential VDD node via the PMOS transistor 31g, the gate of which is controlled by the enable signal RDBEN. The gate of the PMOS transistor 31f is connected to the power supply potential VDD node via the PMOS transistor 31h, the gate of which is controlled by the enable signal RDBEN. The data line pair RDBA, RDBAb is connected to the power supply potential VDD node via the NMOS transistors 31i, 31j respectively, the gates of which are controlled by the enable signal RDBEN.

Next, the operation of the semiconductor integrated circuit shown in FIG. 1 through FIG. 4 is described.

Firstly, a read operation when the bank 10-0 is active and the bank 10-1 is inactive, is described.

When the bank 10-0 is selected and becomes active, the X address in FIG. 2 is decoded by the row address decoder 12 and a word line WL is activated. Data is read and supplied to bit lines BL from one or more memory cells in the memory cell array 11 connected to the activated word line WL, and the data is amplified by the sense amplifier 13. In the meantime, the Y address is decoded by the column address decoder 15 and a pair of bit lines BL is selected. The amplified 16-bit data on the selected pair of bit lines BL is output from the I/O circuit 14-0.

In FIG. 3, a control signal from the control circuit 22 causes the switching circuits 21-0 to 21-15 to operate, and the 8 bits of data line pairs LDB7 to LDB0 and the 8 bits of data line pairs RDB7 to RDB0 are connected by the switching circuits 21-0 to 21-7, while the 8 bits of data line pairs LDB15 to LDB8 and the 8 bits of data line pairs GDB7 to GDB0 are connected by the switching circuits 21-8 to 21-15. Consequently the 8-bit data output from the I/OBLK0 to I/OBLK8 within the I/O circuit 14-0 is supplied to an external circuit from the DQBLK0 to DQBLK3 within the I/O interface circuit 30-0, via the 8 bits of data line pairs LDB7 to LDB0, the switching circuits 21-0 to 21-7, and the 8 bits of data line pairs RDB7 to RDB0. Further, the 8 bits of data output from the I/OBLK9 to I/OBLK17 within the I/O circuit 14-0 is supplied to an external circuit from the DQBLK4 to DQBLK7 within the I/O interface circuit 30-1, via the 8 bits of data line pairs LDB15 to LDB8, the switching circuits 21-8 to 21-15, and the 8 bits of data bus pairs GDB7 to GDB0.

For example, in FIG. 4 during even operation, the data bus GDB5 goes to "H" level due to the NAND gate 15c and PMOS transistor 15g within the I/OBLK2, and the data bus GDBb5 goes to "L" level due to the NOR gate 15f and NMOS transistor 15j. Further, the data line LDB7 goes to "H" level due to the AND gate 16c and PMOS transistor 16g, and the data line LDBb7 goes to "L" level due to the NOR gate 16f and NMOS transistor 16j.

Amplified data from the bank 10-0 is sent to the data line pair DB, DBB, and is then sent to the data line pair IDB, IDBb via the output buffers 17p, 17q. Read data on the data line pair IDB, IDBb is amplified by the RS amplifier (RS AMP) 18f and the NMOS transistors 18g, 18h, and is sent to the data line pair LDB7, LDBb7. At this time, the switching elements 22d, 22e are in the turned-on state and the switching elements 22f, 22g are in the turned-off state due to the X address X161 and the control signals RTRAN1, RTRAN0, so that read data on the data line pair LDB7, LDBb7 is sent to the data line pair RDB7, RDBb7 via the switching elements 22d, 22e. Read data on the data line pair RDB7, RDBb7 is amplified by the RDB amplifier (RDB AMP) 31 in the I/O interface circuit 30-0, and is then latched by the latch circuit of the PMOS transistors 31e, 31f. The resulting signal is output to an external circuit from the pad DQ via the data line pair RDBA, RDBAb.

A write operation when the bank 10-0 is active and the bank 10-1 is inactive will be described. 8 bits of write data are input to the I/O interface circuit 30-0, and 8 bits of write data are input to the I/O interface circuit 30-1. Then, by the opposite route of that above, the 8 bits of data input to the I/O interface circuit 30-0 are written into the bank 10-0 via the 8 bits of data line pairs RDB0 to RDB7, the switching circuit module 20-0, and the 16 bits of data line pairs LDB0 to LDB15. In addition, the 8 bits of data input to the I/O interface circuit 30-1 are written into the bank 10-0 via the 8 bits of data line pairs RDB8 to RDB15, the switching module 20-1, and the 8 bits of data bus pairs GDB0 to GDB7.

When the bank 10-1 is selected, the reading and writing operations are substantially the same as those above.

In this way, in this first embodiment the I/O interface circuit 30-0 close to the bank 10-0 is connected directly to the data line pairs LDB0 to LDB15 and RDB0 to RDB7 via the switching circuit module 20-0, and the other I/O interface circuit 30-1 is connected to the data line pairs LDB0 to LDB15 and RDB8 to RDB15 via the switching circuit modules 20-0, 20-1 and the data bus pairs GDB0 to GDB7. Consequently the number of lines in the data bus pairs GDB0 to GDB7 provided within the chip of the semiconductor integrated circuit is reduced to a half, as compared with of the prior art. Thus, the chip area can be decreased.

Second Embodiment

Figure 5:
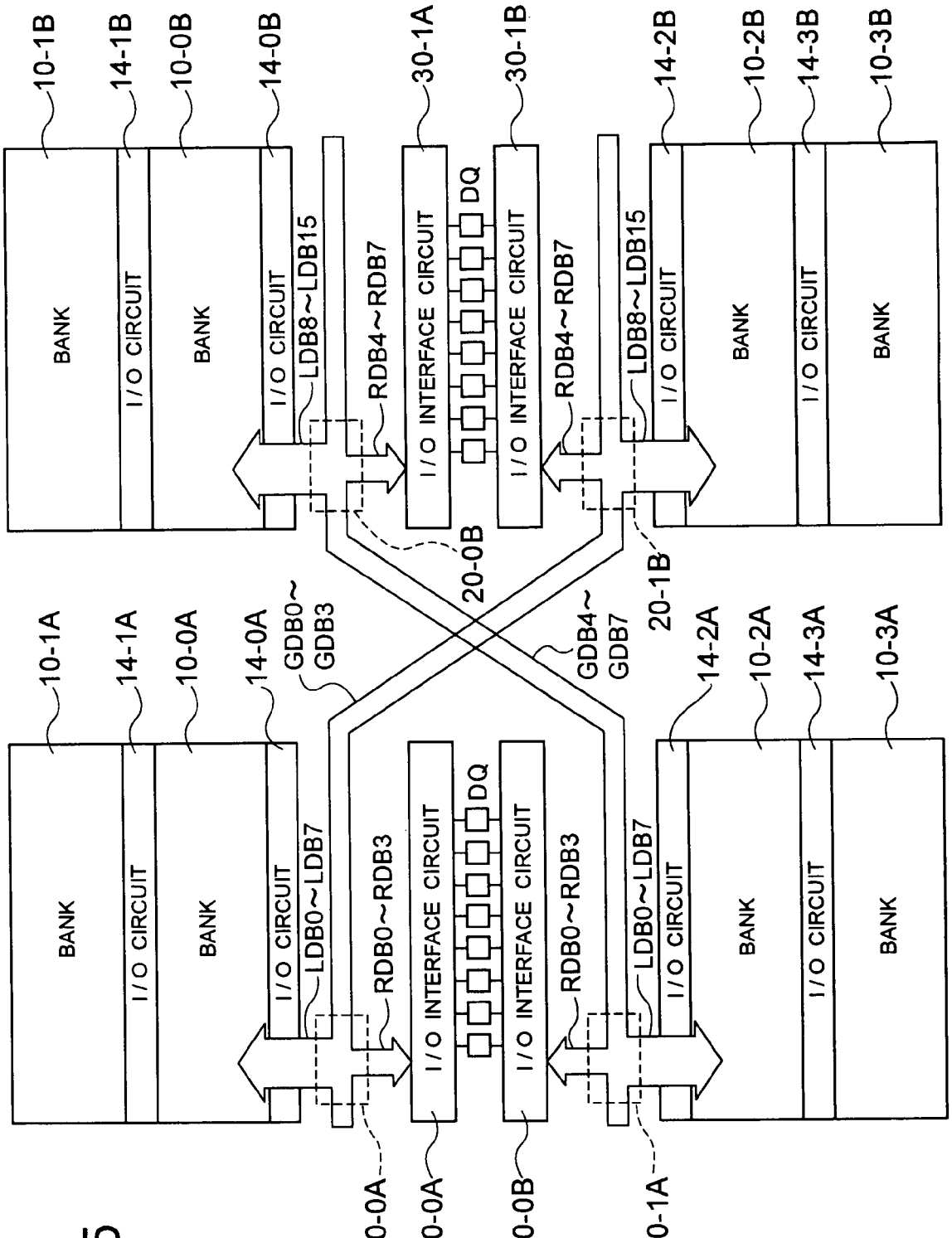

Referring to FIG. 5, the configuration of the semiconductor integrated circuit according to a second embodiment of the present invention will be described. Similar elements in the first and second embodiments are assigned similar symbols in FIG. 1 through FIG. 5.

This semiconductor integrated circuit includes four banks of SDRAM 10-0 to 10-3. Each of the banks 10-0 to 10-3 has a plurality of memory cells. Each of the banks 10-0 to 10-3 is divided laterally into two (10-0A, 10-0B; 10-1A, 10-1B; 10-2A, 10-2B; 10-3A, 10-3B). In the banks 10-0A to 10-3A and 10-0B to 10-3B are provided respective I/O circuits 14-0A to 14-3A and 14-0B to 14-3B.

Between the upper banks 10-0A, 10-0B, 10-1A, 10-1B and the lower banks 10-2A, 10-2B, 10-3A, 10-3B in FIG. 5 are positioned 8-bit I/O interface circuits 30-0, 30-1 on the right and left sides. Each of the 8-bit I/O interface circuits 30-0, 30-1 is split into two in the up-and-down directions, so that four 4-bit I/O interface circuits 30-0A, 30-0B, 31-1A, 31-1B are provided. A common 8-bit pad DQ is provided for the upper left and lower left 8-bit I/O interface circuits 30-0A, 30-0B. Similarly, a common 8-bit pad DQ is provided for the upper right and lower right 8-bit I/O interface circuits 30-1A, 30-1B.

4 bits of data bus pairs GDB0 to GDB3 extend between the banks 10-0A, 10-1A, the I/O interface circuit 30-0A, and the banks 10-2B, 10-3B, the I/O interface circuit 30-1B. The 4 bits of data bus pairs GDB0 to GDB3 also extend between the banks 10-0A, 10-1A and the I/O interface circuit 30-0A, and between the banks 10-2B, 10-3B and the I/O interface circuit 30-1B. Likewise, 4 bits of data bus pairs GDB4 to GDB7 extend between the banks 10-2A, 10-3A, the I/O interface circuit 30-0B, and the banks 10-0B, 10-1B, the I/O interface circuit 30-1A. The 4 bits between the banks 10-2A, 10-3A and the I/O interface circuit 30-0B, and between the banks 10-0B, 10-1B and the I/O interface circuit 30-1A. The 4 bits of data bus pairs GDB4 to GDB7 intersect the 4 bits of data bus pairs GDB0 to GDB3 in the middle.

The I/O circuits 14-0A, 14-1A of the upper left banks 10-0A, 10-1A are connected to the 8 bits of data line pairs LDB0 to LDB7. The 8-bit switching circuit 20-0A connects and disconnects the data line pairs LDB0 to LDB7 to and from the 4-bit I/O interface circuit 30-0A and 4 bits of data bus pairs GDB0 to GDB3. The I/O circuits 14-2B, 14-3B of the lower right banks 10-2B, 10-3B are connected to the 8 bits of data line pairs LDB8 to LDB15. The 8-bit switching circuit 20-1B connects and disconnects the data line pairs LDB8 to LDB15 to and from the 4-bit I/O interface circuit 30-1B and the 4 bits of data bus pairs GDB0 to GDB3.

Similarly, the I/O circuits 14-0B, 14-1B of the upper right banks 10-0B, 10-1B are connected to the 8 bits of data line pairs LDB8 to LDB15. The 8-bit switching circuit 20-0B connects and disconnects the data line pairs LDB8 to LDB15 to and from the 4-bit I/O interface circuit 30-1A and the 4 bits of data bus pairs GDB4 to GDB7. The I/O circuits 14-2A, 14-3A of the lower left banks 10-2A, 10-3A are connected to the 8 bits of data line pairs LDB0 to LDB7. The 8-bit switching circuit 20-1A connects and disconnects the data line pairs LDB0 to LDB7 to and from the 4-bit I/O interface circuit 30-0B and the 4 bits of data bus pairs GDB4 to GDB7.

In this semiconductor integrated circuit, when for example the banks 10-0A and 10-0B are active, and the other banks 10-1A, 10-1B to 10-3A, 10-3B are inactive, the bank 10-0A is connected to the 4-bit I/O interface circuit 30-0B via the data line pairs LDB0 to LDB7, the switching circuit 20-0A and the data line pairs RDB0 to RDB3, and is connected to the 4-bit I/O interface circuit 30-1B via the switching circuit 20-0A, data bus pairs GDB0 to GDB3, switching circuit 20-1B, and data line pairs RDB4 to RDB7. Further, the bank 10-0B is connected to the 4-bit I/O interface circuit 30-1A via the data line pairs LDB8 to LDB15, the switching circuit 20-0B and the data line pairs RDB4 to RDB7, and is also connected to the 4-bit I/O interface circuit 30-0B via the switching circuit 20-0B, data bus pairs GDB4 to GDB7, switching circuit 20-1A, and data line pairs RDB0 to RDB3.

When other banks 10-1A, 10-1B to 10-3A, 10-3B are selected, operation is similar to that above.

As described above, in this second embodiment 8-bit data on the right side and 8-bit data on the left side are transmitted, with 4 bits each via banks 10-0A, 10-0B and vertical routes (data line pairs), and the remaining 4 bits each via horizontal routes (data bus), so that 8 bits of data are transmitted on each of the right and left sides, i.e., 16 bits can be transmitted in total. Consequently, a conventional 16-bit data bus pair can be reduced to a 4-bit data bus pair. In other words, the number of lines in the data bus is ¼ that in the prior art, and the chip area can be greatly reduced.

The present invention is not limited to the illustrated and described embodiments, and various changes and modifications may be made without departing from the scope and spirit of the present invention. Such modifications include, for example, the following three modifications (a) to (c):

Modification(a):

Each of the banks 10-0, 10-1, . . . is made from SDRAM(s) in the illustrated embodiments, but any other suitable memories may be used instead of SDRMs, as long as the semiconductor integrated circuit operates in a similar manner as described above.

Modification(b):

FIG. 1 shows a two-bank configuration, and FIG. 5 shows a four-bank configuration; but the semiconductor integrated circuit operates in a similar manner as described above, even if the semiconductor integrated circuit has a layout other than those shown, and even if the number of the banks is other than two and four.

Modification(c):

The switching circuits 20-0, 20-1, . . . and the I/O interface circuits 30-0, 30-1, . . . may have circuit configurations other than those shown in FIG. 4.

This application is based on a Japanese Patent Application No. 2003-10586, and the entire disclosure thereof is incorporated herein by reference.

What is claimed is:

1. A semiconductor integrated circuit, comprising:
   a plurality of banks, each having a plurality of memory cells, and capable of writing and reading n bits of data (where n is a positive integer) to and from the plurality of memory cells;
   a plurality of input/output means, each capable of receiving a plurality of bits of data from an external circuit and outputting a plurality of bits of data to the external circuit;
   an n/2-bit data bus, extending along the plurality of banks;
   n bits of first data line pairs, each first data line pair being associated with each bank to transmit data between the associated bank and the data bus;
   n/2 bits of second data line pairs, each second data line pair being associated with each first data line pair and each input/output means to transmit data between the data bus and the associated input/output means; and,
   a plurality of switching means for connecting one of the banks with a predetermined one of the input/output means via the associated first data line pair and associated second data line pair, and with other input/output means via the other associated first data line pairs, the n/2 bit data bus and other second data line pair based on a control signal.

2. The semiconductor integrated circuit according to claim 1, wherein an input buffer to input data and an output buffer to output data are provided within each of the banks, and the input buffer and the output buffer are connected to the first data line pairs.

3. The semiconductor integrated circuit according to claim 1, wherein each of the input/output means includes an input/output interface circuit having a plurality of input/output terminals.

4. A semiconductor integrated circuit, comprising:
a plurality of banks, each having a plurality of memory cells, and capable of writing and reading n bits of data (where n is a positive integer) to and from the plurality of memory cells;
a plurality of input/output means, positioned opposing the plurality of banks respectively, each input/output means capable of receiving a plurality of bits of data from an external circuit and of outputting a plurality of bits of data to the external circuit;
an n/2-bit data bus, extending along the plurality of banks between the plurality of banks and the plurality of input/output means;
a plurality of first data line pairs of n bits each, each first data line pair being associated with each input/output means and each bank, and extending between the associated bank and the data bus to transmits data between the associated bank and the data bus;
a plurality of second data line pairs of n/2 bits each, each second data line pair being associated with each first data line pair and each input/output means, and extending between the data bus and the associated input/output means to transmit data between the data bus and the associated input/output means; and,
a plurality of switching means, provided at connection sites of the first data line pairs and the second data line pairs with the data bus, for connecting one of the banks with a predetermined one of the input/output means via the associated first data line pair and associated second data line pair, and with other input/output means via the other associated first data line pairs, the n/2 bit data bus and other second data line pair, based on a control signal.

5. The semiconductor integrated circuit according to claim 4, wherein an input buffer to input data and an output buffer to output data are provided within each of the banks, and the input buffer and the output buffer are connected to the first data line pairs.

6. The semiconductor integrated circuit according to claim 5, wherein each of the input/output means includes an input/output interface circuit having a plurality of input/output terminals.

* * * * *